United States Patent
Mizutani et al.

(10) Patent No.: US 6,602,623 B1
(45) Date of Patent: Aug. 5, 2003

(54) LOW-TEMPERATURE FIRING CERAMIC COMPOSITION, PROCESS FOR PRODUCING SAME AND WIRING SUBSTRATE PREPARED BY USING SAME

(75) Inventors: Hidetoshi Mizutani, Aichi (JP); Tsutomu Sakai, Aichi (JP); Masashi Suzumura, Gifu (JP); Satoshi Iio, Gifu (JP)

(73) Assignee: NGK Spark Plug Co., Ltd., Aichi (JP)

( * ) Notice: Subject to any disclaimer, the term of this patent is extended or adjusted under 35 U.S.C. 154(b) by 0 days.

(21) Appl. No.: 09/695,842

(22) Filed: Oct. 26, 2000

(30) Foreign Application Priority Data

Oct. 27, 1999 (JP) .............................. 11-306072
Sep. 26, 2000 (JP) ....................... 2000-292270

(51) Int. Cl.$^7$ ................................ B32B 9/00
(52) U.S. Cl. ..................... 428/702; 428/689; 428/699; 501/53; 501/108; 501/121; 501/133; 501/122; 501/123; 501/125
(58) Field of Search ............... 428/689, 699, 428/702; 501/53, 94, 108, 121, 133

(56) References Cited

U.S. PATENT DOCUMENTS

| | | | |
|---|---|---|---|
| 5,065,275 A | | 11/1991 | Fujisaki et al. |
| 5,250,360 A | * | 10/1993 | Andrus et al. .............. 428/450 |
| 5,378,662 A | * | 1/1995 | Tsuyuki ....................... 501/17 |
| 5,660,781 A | | 8/1997 | Moriya et al. .............. 264/212 |

FOREIGN PATENT DOCUMENTS

| | | |
|---|---|---|
| JP | 4-139711 | 5/1992 |
| JP | 4-139794 | 5/1992 |
| JP | 4-321293 | 11/1992 |
| JP | 4-352381 | 12/1992 |
| JP | 5-055079 | 3/1993 |
| JP | 6-333429 | 12/1994 |
| JP | 6-338686 | 12/1994 |
| JP | 7-58454 | 3/1995 |
| JP | 7-111372 | 4/1995 |
| JP | 8-73233 | 3/1996 |
| JP | 11-106252 | 4/1999 |

OTHER PUBLICATIONS

European Search Report for EP 00 12 3586 dated Feb. 28, 2003.
K. Ghanbari–Ahari and N. H. Brett, Phase Equilibria and Microstructure in the System $ZrO_2$–MgO–$SiO_2$–SrO Part 2: The Ternary System MgO=$SiO_2$SrO, BR. CERAM. TRANS., vol. 87, No. 3, May 1998, pp. 103–106.

* cited by examiner

Primary Examiner—Deborah Jones
Assistant Examiner—Arden Sperty
(74) Attorney, Agent, or Firm—Sughrue Mion, PLLC

(57) ABSTRACT

A low-temperature firing ceramic composition contains $Sr_2MgSi_2O_7$ crystals forming a major crystal phase of the composition. This composition can be produced, for example, by a process including the steps of (a) mixing together a silica powder, a magnesia powder and a strontium oxide powder to obtain a powder mixture; (b) subjecting the powder mixture to a calcination at a temperature of 1,000–1,200° C. to obtain a calcination product containing $Sr_2MgSi_2O_7$ crystals; (c) mixing the calcination product with alumina powder, boron oxide powder, lithium oxide powder, binder and ethanol to obtain a powder mixture; (d) granulating the powder mixture; (e) shaping the resulting granules into a green body; (f) compacting the green body by a hydrostatic pressing (CIP); and (g) firing the resulting compact in an atmosphere of air, thereby obtaining the composition. A wiring substrate includes a laminate of green sheets, each containing $Sr_2MgSi_2O_7$ crystals, and a wiring pattern formed in an inside of the laminate and/or on a surface of the laminate.

12 Claims, 1 Drawing Sheet

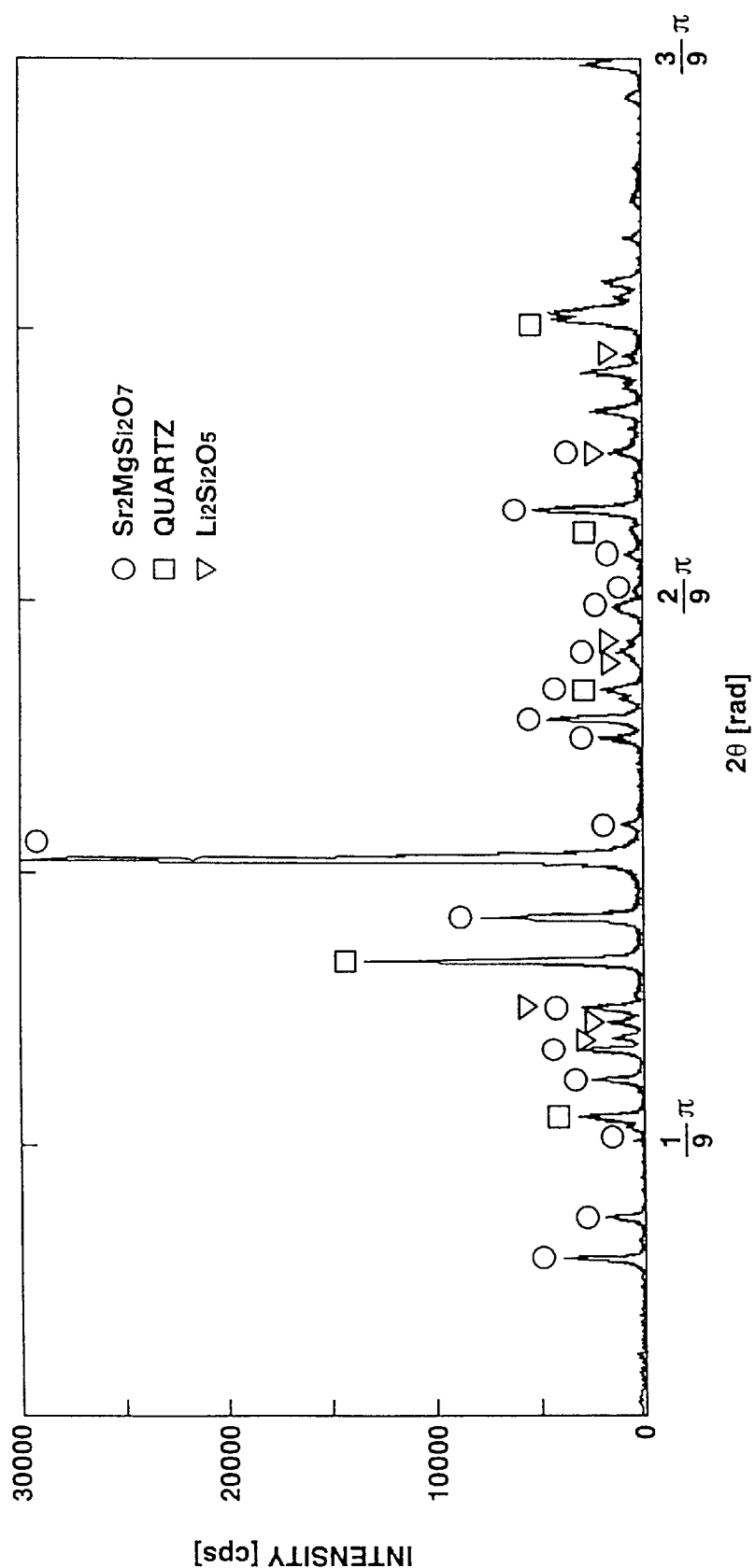
FIGURE

LOW-TEMPERATURE FIRING CERAMIC COMPOSITION, PROCESS FOR PRODUCING SAME AND WIRING SUBSTRATE PREPARED BY USING SAME

BACKGROUND OF THE INVENTION

The present invention relates to a low-temperature firing ceramic composition, a process for producing the composition, and a wiring substrate prepared by using the composition.

Hitherto, alumina has been widely used as an inorganic insulating material used for multilayer circuit substrates, semiconductor packages and the like. In view of recent years trends toward higher processing speed, higher frequency for use, higher wiring density and the like, there is a demand for another inorganic insulating material (i.e., an alternative to alumina) that can be co-fired together with a low-melting-point material (e.g., Au, Ag or Cu), which is low in dielectric constant and resistivity, in place of a high-melting-point material (e.g., W or Mo), and that has a small specific dielectric constant in a high frequency region and a small dielectric loss. As such inorganic insulating materials, there are glass ceramic composites prepared by mixing an amorphous powder(s) with a crystalline powder(s). Such amorphous powders are used for improving sinterability at low temperatures.

Japanese Patent Laid-open Publication JP-A-11-106252 discloses a low-temperature firing glass-ceramic material prepared by adding 0.01–1 wt % of a crystal nucleus powder. U.S. Pat. No. 5,660,781, corresponding to JP-A-8-73233, discloses a process for preparing boron-containing glass ceramic green sheets. JP-A-4-321293 discloses a composition for circuit board, containing an inorganic filler and a special glass frit. JP-A-6-338686 discloses a process for producing a multilayer substrate that is a laminate of glass-ceramic insulating layers and inner wiring patterns. JP-A-7-111372 discloses a low-temperature firing ceramic composition containing 50–70 wt % of a special glass powder and 30–50 wt % of $Al_2O_3$ powder. JP-A-6-333429 discloses a high-frequency dielectric ceramic composition. JP-A-7-58454 discloses a glass-ceramic multilayer substrate having a composition of 40–80 wt % of a special glass component and 20–60 wt % of a filler component.

SUMMARY OF THE INVENTION

It is an object of the present invention to provide a low-temperature firing ceramic composition which enables a co-firing together with a low-boiling-point material and an effective degreasing and has a low dielectric constant, a low dielectric loss and a high thermal expansion.

It is another object of the present invention to provide a process for stably producing such low-temperature firing ceramic composition.

It is still another object of the present invention to provide a wiring substrate prepared by using such low-temperature firing composition, which is substantially free of warp and wave.

According to the present invention, there is provided a low-temperature firing ceramic composition, comprising $Sr_2MgSi_2O_7$ crystals forming a major crystal phase of said composition.

According to the present invention, there is provided a first process for producing a low-temperature firing ceramic composition, comprising:

(a) providing a calcination product comprising a major component of at least one of $Sr_2MgSi_2O_7$ crystal, $SrSiO_3$ crystal and $MgSiO_3$ crystal;

(b) providing a powder mixture comprising 70–99.7 wt % of said calcination product, 0.1–10 wt % of Al, 0.1–10 wt % of B and 0.1–10 wt % of an alkali metal, based on a total weight of said calcination product, said Al, said B and said alkali metal, in terms of oxides in case of said Al, said B and said alkali metal;

(c) shaping said powder mixture into a green body; and (d) firing said green body at a temperature of 850–1,000° C.

According to the present invention, there is provided a second process for producing a low-temperature firing ceramic composition, comprising:

(a) providing a calcination product comprising a major component of at least one of $Sr_2MgSi_2O_7$ crystal, $SrSiO_3$ crystal and $MgSiO_3$ crystal;

(b) providing a powder mixture comprising 65–99.6 wt % of said calcination product, 0.1–10 wt % of Al, 0.1–10 wt % of B, 0.1–10 wt % of an alkali metal and 0.1–5 wt % of a transition metal that is at least one selected from the group consisting of Mn, Ce, Cr, Cu, Co and Ni, based on a total weight of said calcination product, said Al, said B, said alkali metal and said transition metal, in terms of oxides in case of said Al, said B, said alkali metal and said transition metal;

(c) shaping said powder mixture into a green body; and (d) firing said green body at a temperature of 850–1,000° C.

According to the present invention, there is provided a wiring substrate comprising:

a laminate of green sheets each comprising a low-temperature firing ceramic composition comprising $Sr_2MgSi_2O_7$ crystals forming a major crystal phase of said composition; and a wiring pattern formed in an inside of said laminate and/or on a surface of said laminate.

BRIEF DESCRIPTION OF THE DRAWINGS

FIGURE is an X-ray diffraction spectrum of a low-temperature firing ceramic composition according to Run 8 of Example 1.

DESCRIPTION OF THE PREFERRED EMBODIMENTS

A low-temperature firing ceramic composition according to the present invention can be obtained by firing at a low temperature of below 1,000° C. The resulting sintered composition becomes sufficiently compact. Furthermore, this composition unexpectedly has a large thermal expansion coefficient and improved dielectric characteristics in a high frequency region by the use of $Sr_2MgSi_2O_7$ crystals therein. Thus, the composition can suitably be used as a wiring substrate material or dielectric substance. In fact, it is possible to co-fire a green sheet of the composition and a low-melting-point conductive paste (e.g., Au, Ag or Cu) at a low temperature below 1,000° C. in the preparation of a ceramic multilayer substrate. It is possible to stably obtain the composition by the above-mentioned first and second processes. Furthermore, the above-mentioned wiring substrate can suitably be used for high processing speed circuits and high frequency circuits.

As stated above, $Sr_2MgSi_2O_7$ crystals form a major crystal phase of the low-temperature ceramic composition.

This composition may contain 60–99.7 wt % of at least one crystal phase including the major crystal phase of $Sr_2MgSi_2O_7$ crystals. $Sr_2MgSi_2O_7$ crystals are superior in dielectric characteristics in a high frequency region and has a large thermal expansion coefficient. These crystals can be stably present after sintering at a temperature of 1,000° C. or lower, since their melting point is as high as 1,560° C. The major crystal phase is in an amount preferably of at least 20 wt %, more preferably of 20–100 wt %, still more preferably of 30–70 wt %, based on the total weight of all the crystal phases of the composition.

The composition preferably contains Al, B and an alkali metal, besides $Sr_2MgSi_2O_7$ crystals, as described hereinafter.

According to a first preferred embodiment of the invention, there is provided a first low-temperature firing ceramic composition. The first composition comprises 30–99.7 wt % of $Sr_2MgSi_2O_7$ crystals, 0.1–10 wt % of Al, 0.1–10 wt % of B and 0.1–10 wt % of an alkali metal, based on a total weight of the $Sr_2MgSi_2O_7$ crystals, the Al, the B and the alkali metal, in terms of oxides in case of the Al, the B and the alkali metal. The first composition may further comprise other components in an amount of less than 40 wt %.

According a second preferred embodiment of the invention, there is provided a second low-temperature firing ceramic composition. The second composition comprises 30–99.6 wt % of $Sr_2MgSi_2O_7$ crystals, 0.1–69.7 wt % of quartz crystals, 0.1–10 wt % of Al, 0.1–10 wt % of B and 0.1–10 wt % of an alkali metal, based on a total weight of the $Sr_2MgSi_2O_7$ crystals, the quartz crystals, the Al, the B and the alkali metal, in terms of oxides in case of the Al, the B and the alkali metal.

According a third preferred embodiment of the invention, there is provided a third low-temperature firing ceramic composition. The third composition comprises 25–99.6 wt % of the $Sr_2MgSi_2O_7$ crystals, 0.1–10 wt % of Al, 0.1–10 wt % of B and 0.1–10 wt % of an alkali metal and 0.1–5 wt % of the transition metal, based on a total weight of the $Sr_2MgSi_2O_7$ crystals, the Al, the B, the alkali metal and the transition metal, in terms of oxides in case of the Al, the B, the alkali metal and the transition metal.

According a fourth preferred embodiment of the invention, there is provided a fourth low-temperature firing ceramic composition. The fourth composition comprises 25–99.5 wt % of $Sr_2MgSi_2O_7$ crystals, 0.1–74.6 wt % of quartz crystals, 0.1–10 wt % of Al, 0.1–10 wt % of B, 0.1–10 wt % of an alkali metal and 0.1–5 wt % of a transition metal other than Ti, based on a total weight of the $Sr_2MgSi_2O_7$ crystals, the quartz crystals, the Al, the B, the alkali metal and the transition metal, in terms of oxides in case of the Al, the B, the alkali metal and the transition metal.

The amount of $Sr_2MgSi_2O_7$ crystals in each of the first to fourth compositions is preferably 40–80 wt %, more preferably 50–70 wt %, based on the total weight of the above-mentioned components.

The amounts of Al, B and alkali metal in each of the first to fourth compositions are respectively preferably 0.1–5 wt %, more preferably 0.1–3 wt %, based on the total weight of the above-mentioned components, in terms of oxides. In fact, the amounts of Al, B and alkali metal are respectively in terms of $Al_2O_3$, $B_2O_3$ and $A_2O$ where A is an alkali metal. If the amount of Al is less than 0.1 wt %, the resulting dielectric characteristics values may disperse too much. If it is greater than 10 wt %, unnecessary other crystals tend to precipitate and the resulting thermal expansion coefficient may become too low. If the amount of B is less than 0.1 wt %, the resulting sintered composition may not become sufficiently compact. If it is greater than 10 wt %, the resulting dielectric characteristics may become inferior. For example, the dielectric loss may become too large. The alkali metal is added in the preparation of the first to fourth compositions in order to improve sinterability and compactness of the sintered composition. If the amount of the alkali metal is less than 0.1 wt %, this improvement may become insufficient. If it is greater than 10 wt %, the sintered composition may become inferior in insulation and dielectric characteristics. The alkali metal may be contained in the first to fourth compositions, in the form of (1) a crystalline phase different from those of $Sr_2MgSi_2O_7$ crystals and quartz crystals or (2) amorphous phase (glass phase) in grain boundaries and the like. The alkali metal is preferably at least one of Li, Na and K. Of these, Li is particularly preferable.

Similar to the second and fourth compositions, the first composition may further comprise quartz crystals. The amount of these quartz crystals is preferably 69.7 wt % or less, more preferably 20–60 wt %, based on the weight of the first composition. The quartz crystals are contained in the composition in order to further reduce specific dielectric constant and increase thermal expansion coefficient to a value close to that of printed circuit board and the like.

In this specification, the term "the composition" may refer to any of low-temperature firing ceramic compositions according to the invention, such as the above-mentioned first to fourth compositions according to the first to fourth preferred embodiments of the invention.

The weight ratio of quartz crystals to $Sr_2MgSi_2O_7$ crystals in the first, second and fourth compositions is preferably 2.33 or less, more preferably 0.4–1.4. The amount of quartz crystals in each of the second and fourth compositions is preferably 20–60 wt %, more preferably 30–50 wt %. If the amount of quartz crystals is too much (for example, if it is greater than 69.7 wt % in the first and second compositions), the resulting sintered composition may become insufficient in compactness. Each of the first, second and fourth compositions may further comprise a silicon oxide such as tridymite or cristobalite.

A low-temperature firing ceramic composition according to the invention may further comprise a transition metal other than Ti. The amount of the transition metal in each of the third and fourth compositions is 0.1–5 wt %, preferably 0.1–3 wt %, more preferably 0.1–2 wt %. The transition metal is not particularly limited so long as it is not Ti. It is preferably at least one selected from Mn, Ce, Cr, Cu, Co and Ni, more preferably at least one of Mn and Cr. If the transition metal is contained in the composition, it is possible to have advantageous effects of giving a color to the composition and of facilitating degreasing. If the amount of the transition metal is less than 0.1 wt %, these advantageous effects may not be sufficient. If it is greater than 5 wt %, sinterability may become inferior. The amount of the transition metal in the composition is in terms of oxide(s) having an oxidation number with which respective element(s) can be the most stably present. In fact, the amounts of Mn, Ce, Cr, Cu, Co and Ni are respectively in terms of $MnO_2$, $CeO_2$, $Cr_2O_3$, $CuO$, $CoO$ and $NiO$.

The respective amounts of Al, B, the alkali metal and the transition metal in the composition can be determined by conventional chemical analysis methods. The amounts of $Sr_2MgSi_2O_7$ crystals and quartz crystals in the composition can be determined by X-ray diffraction analysis using internal standard method. In this method, it is preferable to select a highly crystalline substance (hereinafter referred to as "internal standard crystals") having a particular, standard spectral peak or line close to a particular peak derived from $Sr_2MgSi_2O_7$ or quartz crystals. In the actual determination, several samples are prepared by varying the content of $Sr_2MgSi_2O_7$ crystals of a high purity, while the content of the internal standard crystals is kept constant. Then, these samples are subjected to X-ray diffraction analysis. A working curve for the determination of $Sr_2MgSi_2O_7$ crystals is prepared by plotting the intensity ratios of the particular peak of $Sr_2MgSi_2O_7$ crystals and that of the internal standard crystals against the amounts of $Sr_2MgSi_2O_7$ crystals in the samples. Then, a sintered composition is ground, followed by the addition of the internal standard crystals. Then, the resulting composition is subjected to X-ray diffraction analysis, and the above-mentioned intensity ratio is obtained, thereby permitting the amount of $Sr_2MgSi_2O_7$ crystals in the sintered composition to be read from the working curve. The amount of quartz crystals in a sintered composition can be determined using an internal standard method substantially the same as above.

The composition preferably contains at least 30 wt % of $Sr_2MgSi_2O_7$ crystals having a particle size (diameter) of 0.1–20 µm. With this, it is possible to make the composition have a sufficiently low dielectric constant, a sufficiently small dielectric loss and a sufficiently high thermal expansion. The particle size is preferably 0.1–10 µm, more preferably 0.1–5 µm. The amount of these $Sr_2MgSi_2O_7$ crystals in the composition is preferably 30–99.7 wt %, more preferably 30–70 wt %.

The composition can have a water absorption of 0.1% or less, a thermal expansion coefficient of 8–15 ppm/° C., a bending strength of 150 MPa or greater, a specific dielectric constant of 7 or less, and a product of no-load quality coefficient and resonance frequency of 3,000 GHz or greater. The bending strength may be 250 MPa or less. The specific dielectric constant may be 4 or greater. The product may be 20,000 GHz or less. The water absorption can be 0.05% or less. Water absorption can be measured in accordance with Japanese Industrial Standard (JIS) C 2141. The thermal expansion coefficient can be 10–15 ppm/° C. Thermal expansion coefficient can be measured with a differential-expansion-type thermal mechanical analysis device or the like. The bending strength can be 180 MPa or greater. Bending strength can be measured in accordance with JIS R 1601. The specific dielectric constant can be 6 or less. The above-mentioned product (Qu×f) can be 5,000 GHz or greater. Specific dielectric constant, no-load quality coefficient and resonance frequency can be measured in accordance with JIS R 1627.

In the first and second processes, the calcination product is preferably a crystalline powder in which crystals are in an amount of at least 80 wt %, preferably at least 90 wt %, more preferably 95–100 wt %, based on the weight of the crystalline powder. Furthermore, 70–99.7 wt % of the calcination product are mixed with the other components in the first process, and 65–99.6 wt % thereof are in the second process. Thus, it is possible in the first and second processes to stably obtain low-temperature firing ceramic compositions of which dielectric characteristics values are almost not dispersed. Furthermore, it is possible to substantially suppress the diffusion of Ag, Cu and the like during firing, since the proportion of glass phase is low. With this, it is possible to obtain a wiring substrate having a wiring pattern with no warp nor wave.

The calcination product in the first and second processes can be prepared by firing a powder mixture comprising a $SiO_2$ powder, a MgO powder and a SrO powder at a temperature of 1,000–1,200° C., followed by a slow cooling at a rate of 20° C. or less per minute to room temperature.

In each of the first and second processes, the amount of the calcination product in the powder mixture is preferably 85–99.7 wt %, more preferably 90–99.7 wt %. If it is less than the minimum value of 70 wt %, the amount of $Sr_2MgSi_2O_7$ crystals may become insufficient. Furthermore, the diffusion of a wiring material may occur during firing due to the increase of amorphous materials. If it is greater than the maximum value, the sintered composition may become insufficient in compactness.

The calcination product in the first and second processes is preferably in the form of a powder having an average particle size of 0.1–20 µm. This average particle size is preferably of 0.1–10 µm, more preferably of 0.1–5 µm. If it is less than 0.1 µm, it may become difficult to handle the powder during the production. For example, the powder may easily fly off. If it is greater than 20 µm, formability, particularly that during sheet casting such as doctor blade process, may become inferior.

In the first and second processes, the amount of each of Al, B and the alkali metal is 0.1–10 wt %, preferably 0.1–5 wt %. As stated above, the alkali metal is preferably at least one of Li, Na and K. Of these, Li is particularly preferable. Each of these Al, B and alkali metal may take either of crystalline and amorphous forms. Furthermore, it is optional to use a composite crystal containing at least two of these Al, B and alkali metal.

In the second process, the amount of the transition metal is in an amount of 0.1–5 wt %, preferably 0.1–3 wt %, in terms of oxide. As stated above, it is at least one selected from Mn, Ce, Cr, Cu, Co and Ni. Of these, it is preferable to use Mn and/or Cr. The form of Mn and/or Cr as compound is not particularly limited and can be oxide. If the amount of the transition metal is less than 0.1 wt %, it may not become possible to obtain an advantageous effect of accelerating degreasing and to obtain a certain color of the composition as originally designed. If it is greater than 5 wt %, sinterability may become inferior.

In the first and second processes, the powder mixture can be shaped into a green body or sheet by a conventional method such as (1) a sheet casting by doctor blade process including lamination of a plurality of sheets, (2) an insulating film formation by screen printing, or (3) pressing. The green body can be fired at a temperature of 850–1,000° C., particularly 900–95° C. If it is lower than 850° C., the degree of firing may become insufficient. A temperature higher than 1,000° C. is not necessary for producing the composition. Since the green body or sheet can be fired at a low temperature below 1,000° C., it is possible to conduct a co-firing of a laminate of the green sheets and a low-melting-point wiring material (e.g., Au, Ag or Cu) of a wiring pattern, thereby producing a wiring substrate of the invention. As mentioned above, the proportion of glass phase during firing is low. Thus, it becomes possible to suppress the diffusion of the wiring material, thereby producing a wiring substrate almost free from warp and wave. In fact, this wiring substrate can be produced by a process similar to the first and second processes.

The following nonlimitative examples are illustrative of the present invention.

EXAMPLE 1

(1) PREPARATION OF CALCINATION PRODUCTS A–E

Calcination Products A–E were prepared by mixing together a silica powder, a magnesia powder and a strontium oxide powder in amounts shown in Table 1, followed by firings for 2 hr at temperatures shown in Table 1. Each of the obtained calcination products was in the form of powder. By X-ray diffraction analysis using CuK α line, each of Calcination Products A, B and D was found to contain $Sr_2MgSi_2O_7$ crystals, $SrSiO_3$ crystals and α-quartz crystals, and each of Calcination Products C and E was found to contain $Sr_2MgSi_2O_7$ crystals, $MgSiO_3$ crystals, $Mg_3SiO_4$ crystals and α-quartz crystals.

TABLE 1

| Calcination Product | $SiO_2$ Powder (wt %) | MgO Powder (wt %) | SrO Powder (wt %) | Calcination Temp. (° C.) |
|---|---|---|---|---|
| A | 56.6 | 7.6 | 35.8 | 1,100 |
| B | 56.3 | 13.6 | 30.1 | ditto |
| C | 61.5 | 6.7 | 31.8 | ditto |
| D | 56.3 | 13.6 | 30.1 | 1,200 |
| E | 61.5 | 6.7 | 31.8 | ditto |

(2) PRODUCTION OF LOW-TEMPERATURE FIRING CERAMIC COMPOSITION

As is seen in Table 2, first to eighteenth low-temperature firing ceramic compositions were respectively produced in accordance with Runs 1–18. In Run 1, Calcination Product A in an amount of 94.5 wt % was mixed with the other components in amounts shown in Table 2 to prepare a powder mixture. Then, a binder and ethanol were added to the powder mixture, and the resulting mixture was granulated and then shaped by a pressure of 80 MPa. After that, a hydrostatic pressing (CIP) was conducted with a pressure of 150 MPa, followed by firing at a temperature shown in Table 2 in an atmosphere of air, thereby obtaining a first sintered composition. Each of Runs 2–18 was conducted in the same manners as those of Run 1, except that the powder mixture composition and the firing temperature were changed as shown in Table 2.

TABLE 2

| | Calcination Product (wt %) | $Al_2O_3$ (wt %) | $B_2O_3$ (wt %) | $Li_2O$ (wt %) | $Na_2O$ (wt %) | $K_2O$ (wt %) | Transition Metal (wt %) | Firing Temp (° C.) |
|---|---|---|---|---|---|---|---|---|
| Run 1 | A (94.5) | 3 | 0.5 | 2 | 0 | 0 | 0 | 900 |
| Run 2 | A (95.0) | 2 | 1 | 1 | 1 | 0 | 0 | 900 |
| Run 3 | A (96.0) | 1 | 2 | 0.5 | 0.5 | 0 | 0 | 1000 |
| Run 4 | B (94.0) | 3 | 1 | 1 | 0 | 1 | 0 | 900 |
| Run 5 | D (95.0) | 2 | 1 | 2 | 0 | 0 | 0 | 900 |
| Run 6 | B (96.5) | 1 | 1 | 0.5 | 1 | 0 | 0 | 950 |
| Run 7 | C (94.5) | 2 | 0.5 | 2 | 1 | 0 | 0 | 900 |
| Run 8 | C (95.5) | 3 | 0.5 | 1 | 0 | 0 | 0 | 900 |
| Run 9 | E (95.5) | 2 | 0.5 | 1 | 1 | 0 | 0 | 950 |
| Run 10 | C (95.0) | 3 | 0.5 | 0.5 | 1 | 0 | 0 | 950 |
| Run 11 | B (86.0) | 2 | 1 | 6 | 5 | 0 | 0 | 850 |
| Run 12 | C (81.0) | 1 | 15 | 2 | 1 | 0 | 0 | 850 |
| Run 13 | A (92) | 1 | 2 | 2 | 1 | 1 | $MnO_2$ (1) | 900 |
| Run 14 | A (91) | 2 | 3 | 2 | 0 | 1 | $CeO_2$ (1) | 900 |
| Run 15 | A (91) | 1 | 3 | 1 | 1 | 2 | $Cr_2O_3$ (1) | 950 |
| Run 16 | C (90) | 2 | 3 | 2 | 1 | 1 | CuO (1) | 900 |
| Run 17 | C (91) | 3 | 2 | 2 | 0 | 1 | CoO (1) | 900 |
| Run 18 | C (90) | 2 | 3 | 2 | 1 | 1 | NiO (1) | 900 |

(3) EVALUATION

Evaluation of the first to eighteenth sintered compositions was conducted with respect to water absorption, thermal expansion coefficient, bending strength, specific dielectric constant, and product of no-load quality coefficient (Qu) and resonance frequency (f). The test results are shown in Table 3. In fact, water absorption was measured in accordance with JIS C 2141. As shown in Table 3, water absorption of each sintered composition of Runs 1–18 was less than 0.1%. The thermal expansion coefficient test was conducted by machining each sintered composition to a test sample having a diameter of 4 mm and an axial length of 20 mm and then by measuring thermal expansion coefficient of this test sample with a differential-expansion-type thermal mechanical analysis device, TMA8140C (trade name) of Rigaku Co., in a range of 30–400° C. The bending strength test was conducted by grinding each sintered composition to a test sample having dimensions of 40 mm in length, 3 mm in thickness and 4 mm in width and then by measuring 3-point bending strength of this test sample in accordance with JIS R 1601. Dielectric characteristics were measured using $TE_{001}$ mode of the parallel conductive plate type dielectric resonator method in accordance with JIS R 1627.

TABLE 3

| | Water Absorption (%) | Specific Dielectric Constant | Qu × f (GHz) | Bending Strength (MPa) | Thermal Expansion Coefficient (ppm/° C.) |
|---|---|---|---|---|---|
| Run 1 | <0.1 | 6.2 | 3900 | 160 | 10.6 |
| Run 2 | | 6.1 | 4100 | 170 | 10.4 |
| Run 3 | | 6.2 | 4500 | 150 | 10.2 |
| Run 4 | | 6.4 | 4800 | 180 | 12.4 |
| Run 5 | | 6.3 | 5100 | 170 | 12.1 |
| Run 6 | | 6.3 | 5300 | 160 | 12.2 |

TABLE 3-continued

| | Water Absorption (%) | Specific Dielectric Constant | Qu × f (GHz) | Bending Strength (MPa) | Thermal Expansion Coefficient (ppm/° C.) |
|---|---|---|---|---|---|
| Run 7 | | 5.7 | 4800 | 170 | 11.3 |
| Run 8 | | 5.9 | 5500 | 180 | 11.5 |
| Run 9 | | 5.6 | 5200 | 170 | 11.4 |
| Run 10 | | 5.9 | 4900 | 190 | 11.3 |
| Run 11 | | Very Weak Resonance | | 130 | 12.2 |
| Run 12 | | ditto | | 140 | 10.8 |
| Run 13 | | 6.1 | 4100 | 200 | 10.8 |
| Run 14 | | 6.2 | 4000 | 190 | 10.4 |
| Run 15 | | 6.2 | 4300 | 170 | 10.6 |
| Run 16 | | 5.6 | 4500 | 190 | 11.3 |
| Run 17 | | 5.9 | 5200 | 180 | 11.2 |
| Run 18 | | 5.7 | 4700 | 180 | 12.0 |

Furthermore, each sintered composition of Runs 1–18 was subjected to X-ray diffraction analysis using CuK α line. With this, each sintered composition was found to contain $Sr_2MgSi_2O_7$ crystals as a major crystal phase of the composition. Furthermore, each sintered composition except those of Runs 3, 6 and 10 was found to contain quartz crystals and $Li_2Si_2O_5$ crystals besides $Sr_2MgSi_2O_7$ crystals. Each sintered composition of Runs 3, 6 and 10 was found to contain quartz crystals besides $Sr_2MgSi_2O_7$ crystals. FIG. 1 shows an X-ray diffraction spectrum of the sintered composition of Run 8.

The surface of each sintered composition of Runs 1–18 was subjected to polishing for mirror finish and then observed with a scanning electron microscope. With this, each sintered compostion of Runs 1–18 was found to contain $Sr_2MgSi_2O_7$ crystals of a particle size range of 0.5–5 μm.

Regarding the test results of Runs 1–10 and 13–18 shown in Table 3, it is understood that each specific dielectric constant is sufficiently low, that each product (Qu×f) is sufficiently large, that each bending strength is sufficiently large, and that each thermal expansion coefficient is sufficiently large. Regarding the test results of Runs 11 and 12 shown in Table 3, it was not possible to determine specific dielectric constant and Qu×f by the above-explained method due to very weak resonances. It is, however, possible to use the RF impedance method for determining specific dielectric constant of the sintered compositions of Runs 11–12, and the resulting values of Runs 11–12 are comparable to those of Runs 1–10. Thus, it is assumed that the sintered compositions of Runs 11–12 are preferably used in a low frequency range of 1 GHz or lower. The reason of this is assumed to be because the total weight of Li, Na and K in terms of oxides in Run 11 (see Table 2) is greater than 10 wt % and because the weight of Al in terms of oxide in Run 12 is greater than 10 wt %.

EXAMPLE 2

At first, a powder mixture was prepared by mixing together 33.93 wt % of a strontium oxide powder, 7.22 wt % of a magnesia powder, 53.73 wt % of a silica powder, 0.85 wt % of an alumina powder, 2.56 wt % of a boron oxide powder, and 1.71 wt % of a lithium oxide powder. Then, the powder mixture was fired at 850° C. to obtain a first calcined powder (calcination product). Then, a binder and ethanol were added to this powder, then granulated, and then shaped by a pressure of 80 MPa. After that, a hydrostatic pressing was conducted with a pressure of 150 MPa, followed by firing at 1,000° C. in an atmosphere of air, thereby obtaining a first sintered composition. Second and third sintered compositions were each produced in the same manner as that of the first sintered composition, except that the temperatures for obtaining second and third calcined powders were respectively 900° C. and 950° C., in place of 850° C.

Each of the first, second and third sintered compositions was found to have a water absorption of not greater than 0.1% and therefore was sufficient in compactness. Each of them was found by X-ray diffraction analysis to contain $Sr_2MgSi_2O_7$ crystals. The surface of each of them was subjected to polishing for mirror finish and then observed with a scanning electron microscope. With this, it was found that the structure was not homogeneous and that pores remained partially. The product Qu×f of each composition was determined in the same manner as above and found to be not greater than 2,000 GHz. This means that each composition has a large dielectric loss. Thus, it is preferable to use a crystalline calcined powder having an average particle diameter, for example, of 0.1–20 μm in order to produce a sintered composition that is suitable for a wiring substrate.

EXAMPLE 3

A powder mixture was prepared by mixing Calcination Product C of Example 1 with the other components shown in Run 1 of Table 2. Then, an acrylic binder (e.g., an ethyl or isobutyl methacrylate based acrylic binder), a plasticizer (e.g., dibutylphthalate or dioctylphthalate), and a nonionic dispersing agent were added to the powder mixture. The resulting mixture was formed into a slurry using toluene, methyl ethyl ketone and an alcohol as a solvent. Then, this slurry was shaped into first to fourth green sheets each having a thickness of 0.3 mm by doctor blade process. A wiring pattern was printed on a surface of the first green sheet with a silver paste. Then, the second green sheet was placed on the surface thereof, thereby obtaining a first laminate. Similarly, a wiring pattern was printed on a surface of the third green sheet with a copper paste. Then, the fourth green sheet was placed on the surface thereof, thereby obtaining a second laminate. The first laminate was fired for 2 hr at 900° C. in an atmosphere of air, thereby obtaining a first wiring substrate. The second laminate was subjected to a removal of the binder at 750° C. in a mixture of nitrogen and water vapor and then to a firing at 900° C. for 2 hr in an atmosphere of nitrogen, thereby obtaining a second wiring substrate.

Each of the first and second wiring substrates was subjected to X-ray diffraction analysis using CuK α line. With this, each of them was found to contain $Sr_2MgSi_2O_7$ crystals, forming a main crystal phase, and quartz crystals. The surface of each wiring substrate was subjected to a polishing for mirror finish and then observed with a scanning electron microscope. With this observation, each wiring substrate was found to have no reaction with the wiring pattern and almost no warp nor wave of the wiring pattern. Furthermore, each wiring substrate was found to have superior dielectric characteristics, a large thermal expansion and a superior mechanical strength.

The entire disclosure of each of Japanese Patent Application Nos. 11-306072 filed on Oct. 27, 1999 and 2000-292270 filed on Sep. 26, 2000, including specification, claims, drawings and summary, is incorporated herein by reference in its entirety.

What is claimed is:
1. A wiring substrate comprising:
   a laminate of green sheets each comprising a low-temperature firing ceramic composition comprising

$Sr_2MgSi_2O_7$ crystals forming a major crystal phase of said composition; and a wiring pattern formed in an inside of said laminate and/or on a surface of said laminate, wherein said major crystal phase is in an amount of 20–100 wt % based on a total weight of all crystal phases of said composition, wherein said composition further comprises Al, B and an alkali metal.

2. A wiring substrate according to claim 1, wherein said composition comprises 30–99.7 wt % of said $Sr_2MgSi_2O_7$ crystals, 0.1–10 wt % of Al calculated as $Al_2O_3$, 0.1–10 wt % of B calculated as $B_2O_3$ and 0.1–10 wt % of an alkali metal calculated as $A_2O$ where A represents an alkali metal, based on a total weight of said $Sr_2MgSi_2O_7$ crystals, said Al, said B and said alkali metal.

3. A wiring substrate according to claim 2, wherein said alkali metal is at least one selected from the group consisting of Li, Na and K.

4. A wiring substrate according to claim 1, wherein said composition further comprises quartz crystals.

5. A wiring substrate according to claim 4, wherein a weight ratio of said quartz crystals to said $Sr_2MgSi_2O_7$ crystals is 2.33 or less.

6. A wiring substrate according to claim 4, wherein said composition comprises 30–99.6 wt % of said $Sr_2MgSi_2O_7$ crystals, 0.1–69.7 wt % of said quartz crystals, 0.1–69.7 wt % of said quartz crystals, 0.1–10 wt % of Al calculated as $Al_2O_3$, 0.1–10 wt % of B calculated as $B_2O_3$ and 0.1–10 wt % of an alkali metal calculated as $A_2O$ where A represents an alkali metal, based on a total weight of said $Sr_2MgSi_2O_7$ crystals, said quartz crystals, said Al, said B and said alkali metal.

7. A wiring substrate according to claim 1, wherein said composition further comprises a transition metal other than Ti.

8. A wiring substrate according to claim 7, wherein said composition comprises 25–99.6 wt % of said $Sr_2MgSi_2O_7$ crystals, 0.1–10 wt % of Al calculated as $Al_2O_3$, 0.1–10 wt % of B calculated as $B_2O_3$ and 0.1–10 wt % of an alkali metal calculated as $A_2O$ where A represents an alkali metal and 0.1–5 wt % of said transition metal calculated as an oxide of said transition metal, based on a total weight of said $Sr_2MgSi_2O_7$ crystals, said Al, said B, said alkali metal and said transition metal.

9. A wiring substrate according to claim 4, wherein said composition comprises 25–99.5 wt % of said $Sr_2MgSi_2O_7$ crystals, 0.1–74.6 wt % of said quartz crystals, 0.1–10 wt % of Al calculated as $Al_2O_3$, 0.1–10 wt % of B calculated as $B_2O_3$, 0.1–5 wt % of an alkali metal calculated as $A_2O$ where A represents an alkali metal, and 0.15 wt % of a transition metal other than Ti, calculated as an oxide of said transition metal, based on a total weight of said $Sr_2MgSi_2O_7$ crystals, said quartz crystals, said Al, said B, said alkali metal and said transition metal.

10. A wiring substrate according to claim 7, wherein said transition metal is at least one selected from the group consisting of Mn, Ce, Cr, Cu, Co and Ni.

11. A wiring substrate according to claim 1, wherein said composition comprises at least 30 wt % of said $Sr_2MgSi_2O_7$ crystals having a particle size of 0.1–20 μm.

12. A wiring substrate according to claim 1, wherein said composition comprises a water absorption of 0.1% or less, a thermal expansion coefficient of 8–15 ppm/° C., a bending strength of 150 MPa or greater, a specific dielectric constant of 7 or less, and a product of no-load quality coefficient and resonance frequency of 3,000 GHz or greater.

* * * * *